United States Patent
Gupta et al.

(10) Patent No.: US 7,634,302 B2
(45) Date of Patent: Dec. 15, 2009

(54) METHOD FOR DIFFERENTIATING TISSUES IN MAGNETIC RESONANCE IMAGING

(75) Inventors: Rakesh Kumar Gupta, Lucknow (IN); Anasuya Mohan Rao, Bangalore (IN); Ramesh Venkatesan, Bangalore (IN)

(73) Assignee: General Electric Company, Schenectady, NY (US)

( * ) Notice: Subject to any disclaimer, the term of this patent is extended or adjusted under 35 U.S.C. 154(b) by 658 days.

(21) Appl. No.: 10/888,600

(22) Filed: Jul. 9, 2004

(65) Prior Publication Data

US 2006/0020197 A1 Jan. 26, 2006

(51) Int. Cl.
*A61B 5/05* (2006.01)
(52) U.S. Cl. .................. 600/410; 600/419; 324/307; 324/309; 324/310
(58) Field of Classification Search ......... 600/407–480; 324/307, 309, 310
See application file for complete search history.

(56) References Cited

U.S. PATENT DOCUMENTS

| | | | | |
|---|---|---|---|---|
| 5,539,310 | A * | 7/1996 | Basser et al. ............. | 324/307 |
| 5,560,360 | A * | 10/1996 | Filler et al. ............... | 600/408 |
| 5,671,741 | A * | 9/1997 | Lang et al. ............... | 600/415 |
| 5,833,610 | A * | 11/1998 | Yokawa et al. ........... | 600/419 |
| 6,023,634 | A * | 2/2000 | Hanawa et al. ........... | 600/410 |
| 6,321,105 | B1 * | 11/2001 | Jenkins et al. ............ | 600/407 |
| 6,377,046 | B1 * | 4/2002 | Debbins et al. ........... | 324/309 |
| 6,526,305 | B1 * | 2/2003 | Mori ....................... | 600/410 |
| 6,529,763 | B1 * | 3/2003 | Cohen et al. ............. | 600/410 |
| 6,943,033 | B2 * | 9/2005 | Van Zijl et al. ........... | 436/173 |
| 6,992,484 | B2 * | 1/2006 | Frank ...................... | 324/307 |
| 7,020,578 | B2 * | 3/2006 | Sorensen et al. .......... | 702/181 |
| 2002/0042569 | A1 * | 4/2002 | Wedeen .................... | 600/411 |
| 2002/0103429 | A1 * | 8/2002 | deCharms ................. | 600/410 |
| 2003/0160610 | A1 * | 8/2003 | Van Zijl et al. ........... | 324/300 |
| 2005/0033154 | A1 * | 2/2005 | deCharms ................. | 600/410 |
| 2005/0207631 | A1 * | 9/2005 | Martens et al. ........... | 382/131 |
| 2006/0020197 | A1 * | 1/2006 | Gupta et al. .............. | 600/410 |
| 2006/0241374 | A1 * | 10/2006 | George et al. ............. | 600/410 |

OTHER PUBLICATIONS

Hanyu et al., "Diffusion-weighted Magnetic Resonance and Magnetization Transfer Imaging in the Assessment of Ischemic Human Stroke", 1998, Internal Medicine, vol. 37, No. 4, pp. 360-365.*
Lin et al., "Reduction of RF Power for Magnetization Transfer With Optimized Application of RF Pulses in k-Space", 2003, Magnetic Resonance in Medicine 50, pp. 114-121.*
Rizi et al., "Intermolecular Zero-Quantum Coherence Imaging of the Human Brain", 2000, Magnetic Resonance in Medicine 50, pp. 627-632.*
Hanyu et al., "Diffusion-weighted Magnetic Resonance and Mangetization Transfer Imagin in the Assessment of Ischemic Human Strok", 1998, Internal Medicine, vol. 37, No. 4, pp. 360-365.*

* cited by examiner

*Primary Examiner*—Brian Casler
*Assistant Examiner*—Nasir Shahrestani
(74) *Attorney, Agent, or Firm*—Peter Vogel, Esq.; Jean Tibbetts, Esq.; Michael G. Smith, Esq.

(57) ABSTRACT

A method of differentiating tissues in Magnetic Resonance Imaging (MRI) comprising applying a Magnetization Transfer (MT) pre-pulse in combination with the Diffusion Weighted Imaging (DWI) pulse sequence to obtain an image of the tissue under evaluation. Analysis maps and/or measurements are generated from the obtained image, from which values representative of the macromolecular content are computed for obtaining tissue differentiation.

27 Claims, 1 Drawing Sheet

METHOD FOR DIFFERENTIATING TISSUES IN MAGNETIC RESONANCE IMAGING

BACKGROUND OF THE INVENTION

This invention relates to a method for differentiating tissues in Magnetic Resonance Imaging (MRI), and more particularly, to a method for quantitatively differentiating tissues that are rich in macromolecules from those containing small molecules (e.g. with a molecular weight of about 3K Daltons), in Magnetic Resonance Imaging.

Tissue differentiation and localization always have been basic goals of magnetic resonance imaging. Over the years, attempts to distinguish between tissues that are rich in macromolecules and tissues that contain small molecules have resulted in several quantitative techniques. Known methods of such quantitative techniques include T2-weighted imaging, Magnetization Transfer (MT) weighted imaging, Diffusion Weighted Imaging (DWI) etc., which involve creating different signals for tissue differentiation. However, these signals also contain either T1 or T2 weighting, and therefore, interpretation of these images requires more holistic thinking, understanding the effect(s) of pathology on these additional weighting factors and their effects on the signal.

Imaging contrast generated with magnetization transfer (MT) technique is dependent on the phenomenon of magnetization exchange between semisolid macromolecular protons and water protons. This technique has the ability to indirectly image the presence of semisolids such as protein matrices and cell membranes whose magnetization dies away too quickly to be imaged directly. MT contrast (MTC) has proved to be a useful diagnostic tool in characterization of a variety of central nervous system pathologies including infection, demyelination, and other neurodegenerative conditions. Although Magnetization Transfer (MT) imaging eliminates the T2 effect, T1 effects are apparent and found to affect SNR (signal-to-noise ratio) of the image.

Transverse signal relaxivity (R2) maps are not very sensitive and typically require a large effect to occur before indicating the change.

Diffusion Weighted-Echo Planar Imaging (DW-EPI) is known for imaging evaluation of intra-cranial tumors and also to detect and distinguish between acute hemorrhagic and non-hemorrhagic strokes.

Diffusion measurements in vivo are useful for tissue characterization as they provide information on the mobility of water or cell metabolites. MR images can be sensitized to diffusion by means of large magnetic field gradient pulses, allowing non-invasive estimation of apparent diffusion coefficient (ADC). Disruption of the permeability or geometry of structural barriers by pathology alters the diffusion behavior of water molecules. Thus, characterizing diffusion in the brain provides a technique to investigate the effects of disease processes on tissue microstructure.

At present, the most important clinical application of diffusion weighted imaging (DWI) technique is in the detection and characterization of cerebral ischemia. DWI is gradually being used in the evaluation of other intra-cranial pathologies like tumors, abscess and encephalitis. DWI is exquisitely sensitive to axonal directionality in the brain white matter and used for the study of demyelination due to trauma or axonal disruption, which is taken advantage of in the increasing applications of diffusion tensor imaging (DTI). DW-EPI has also enabled in vivo measurement of diffusion in abdominal organs such as liver and kidneys.

Apparent Diffusion Coefficient (ADC) maps and choline maps, although independent of T1 and T2 effects and indicate macromolecular content in quantitative fashion, are found to vary making the changes found for subtle differences in macro-molecular content statistically insignificant at a magnetic field strength of 1.5T.

Thus, these known techniques do not provide a tissue differentiation method that would enable evaluation of the combined effects of diffusion and magnetization transfer on normal brain parenchyma and pathological tissues and thereby obtain a quantifiable differentiation of tissues based on macromolecular content.

BRIEF DESCRIPTION OF THE INVENTION

In an embodiment, a method of differentiating tissue in Magnetic Resonance Imaging is provided. The method comprises applying a Magnetization Transfer (MT) pre-pulse in combination with a Diffusion Weighted Imaging (DWI) pulse sequence to obtain an image of the tissue under evaluation. Analysis maps and/or measurements are generated from the obtained image, from which values representative of the macromolecular content are computed.

DETAILED DESCRIPTION OF THE INVENTION

Figure 1:
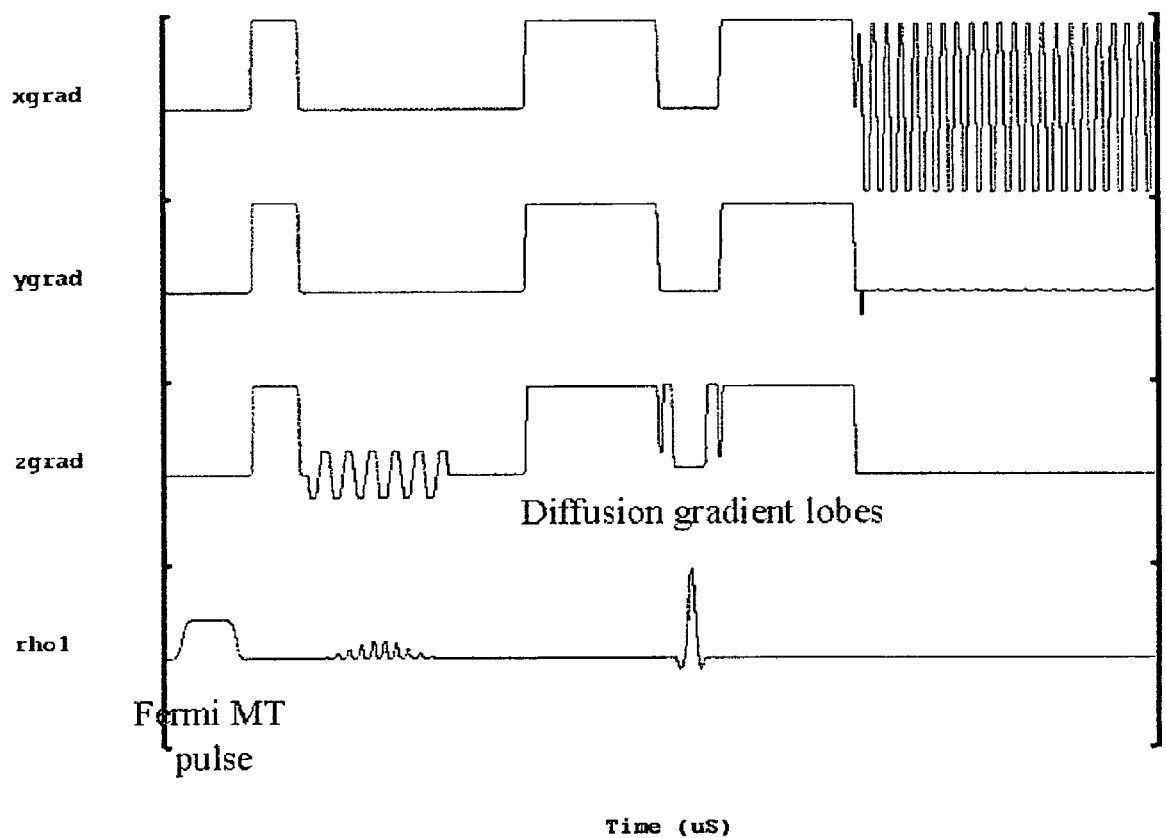
FIG. 1 shows the pulse sequence according to one embodiment of the present invention.

Various embodiments of the present invention provide a method for tissue differentiation in magnetic resonance imaging, especially for diagnosing cystic tumors, aspirated abscess etc., on patients. However, the embodiments are not so limited, and may be implemented in connection with other systems such as, for example, in diagnosing psychiatric disorders, for example, conversion disorders, schizophrenia, unipolar or bipolar depression, epilepsy, etc.

In general, a method of differentiating tissue according to the present invention comprises creating quantifiable differentiation of tissues based on macromolecular content. The method comprises applying a Magnetization Transfer (MT) pre-pulse in combination with a Diffusion Weighted Imaging (DWI) pulse sequence to produce an image of the tissue under evaluation. Analysis maps and/or measurements are generated from the produces image. Values representative of the macromolecular content of the tissues are computed from the map and/or measurements, wherein the Magnetization Transfer (MT) pre-pulse suppresses signals from water bound to macromolecules.

Referring to FIG. 1, in the embodiment shown, the method comprises applying an off-resonance Magnetization Transfer (MT) pre-pulse in combination with a Diffusion Weighted Echo-Planar Imaging (DW-EPI) pulse sequence to produce an image of the tissue under evaluation. An Apparent Diffusion Coefficient (ADC) map is generated from the obtained image and then ADC values are computed from the generated map. The applied off resonance Magnetization Transfer (MT) pre-pulse suppresses signals from water bound to macromolecules and thereby reduces the influence of bound water molecules on the apparent diffusivity of the tissue. As a result, the apparent diffusion coefficient (ADC) of the tissue that is rich in macromolecular content is increased due to lower diffusivity of the bound water pool compared to free water pool.

In an embodiment, the applied Magnetization Transfer (MT) pre-pulse is an off-resonance pulse shaped to have a Fermi envelope. In further embodiments, the Magnetization Transfer (MT) pre-pulse may include off-resonance sinc pulse, binomial pulse, etc. In one embodiment, the duration of the Magnetization Transfer (MT) pre-pulse is about 2 to 32 ms. In an example, the duration of the Magnetization Transfer (MT) pre-pulse is of about 8 ms. In another example, the duration of the Magnetization Transfer (MT) pre-pulse is about 16 ms. In an embodiment, the flip angle of the Magnetization Transfer (MT) pre-pulse is in the range of about 600 to 1100 deg. In one example, the flip angle of the Magnetization Transfer (MT) pre-pulse is about 670 deg. In an embodiment, the resonance offset of the magnetization transfer coefficient is in the range of about 400 to 1600 Hz. In one example, the resonance offset of the magnetization transfer coefficient is about 1200 Hz. In an embodiment, the Magnetization Transfer (MT) pre-pulse has a higher power with narrow excitation profile. It should be noted that Magnetization Transfer (MT) pre-pulse with higher power and narrow excitation profile results in higher sensitivity of the MT-ADC maps for small differences in macromolecular content. It should also be noted that the Magnetization Transfer (MR) pre-pulse may be incorporated in any MRI scanner with diffusion weighted imaging capability.

It should be noted that various embodiments may include Diffusion Weighted Imaging pulse sequences such as, for example, diffusion-weighted echo planar imaging (DW-EPI) pulse sequence, a single shot diffusion-weighted fast spin echo pulse sequence, a diffusion weighted propeller imaging sequence, fluid attenuated inversion recovery (FLAIR) pulse sequence etc. Further embodiments may include diffusion tensor imaging (DTI) pulse sequence In one embodiment, the method comprises applying a Magnetization Transfer (MT) pre-pulse in combination with a Diffusion Tensor Imaging (DTI) pulse sequence to produce an image of a tissue under evaluation. Analysis maps and/or measurements are generated from the produced image wherein the obtained analysis maps and/or measurements are used for fiber tractography.

For example, the analysis maps and/or measurements obtained from Diffusion Tensor Imaging (DTI) are used for elucidation of white matter tracts.

EXAMPLE 1

A total of 10 healthy age and sex-matched volunteers were scanned after taking their informed consent. All these volunteers were male between 27-35 years of age. Imaging experiments were performed on 1.5-T clinical MR scanner (Signa; GE Medical Systems, Milwaukee, Wis.), using a quadrature head coil available with the scanner. All experiments were carried out with a modified single shot SE-DWEPI pulse sequence, with and without MT preparation pulse.

The imaging parameters used were:
TR/TE=10.5 s/10 ms (minimum TE),
FOV=40 cm, number of excitation=2,
slice thickness 5 mm,
interslice gap=0.1 mm with matrix size of 128×128.

Diffusion gradients were applied along all orthogonal directions (namely X, Y and Z) with a "b" value of 1000 s/mm2. The MT RF pulses used were Fermi pulses of 16 ms duration with a flip angle of 670 deg: and resonance offset of 1200 Hz. The MT pulses were applied in every TR.

It was found that a short (8 ms) Fermi-shaped off resonance MT pre-pulse also increased the computed ADC of tissues with almost no macromolecular content. This was postulated to have been because of some weak sideband excitation of the free water pool. So, a longer (16 ms) off-resonance Fermi-shaped MT pulse was incorporated as a choice in the pulse sequence and was seen to produce no observable change in tissues with very little macromolecule content. Also, more consistent increases in tissues with macromolecules were observed. It is to be noted that higher MT pre-pulse power with narrow excitation profiles created higher sensitivity of the MT-ADC values to small differences in macromolecular content.

All parameters for MT-prepared DW imaging were identical to those with DW sequence except for the addition of the off resonance pulse.

An apparent diffusion coefficient (ADC) map for both sets of data was generated using a commercial package on the GE Medical Systems post-processing workstation.

Region of interest (ROI) analysis from different locations in the brain white matter was done in corresponding set of images with and without the off-resonance pulse. The ROI analysis was done by placing voxel of 2×2 in frontal, occipital lobes and basal ganglia. Care was taken to avoid regions with Cerebrospinal Fluid (CSF) and increased susceptibility while placing ROI. Mean and standard deviation from the ADC values obtained from these different locations without and with MT pre-pulse were calculated and compared for any statistical significance using student's t-test. Probability (p) values equal to or less than 0.05 were considered as statistically significant as shown in Table 1.

TABLE 1

Apparent diffusion coefficient values from different regions of the brain parenchyma with and without MT pre-pulse (A = Without MT pre-pulse; B = with MT pre-pulse)

| Location | ADC values (no MT) $\times 10^{-3}$ mm$^2$/sec (A) | ADC values (with MT) $\times 10^{-3}$ mm$^2$/sec (B) | p value (A vs B) |
|---|---|---|---|
| Frontal Lobe | 0.78 +/− 0.05 | 0.80 +/− 0.04 | 0.05 |
| Basal Ganglia | 0.74 +/− 0.04 | 0.77 +/− 0.04 | 0.007 |
| Occipital Lobe | 0.77 +/− 0.05 | 0.80 +/− 0.06 | 0.03 |

The results of these experiments are summarized in Table 1. The mean ADC values without the application of MT pre-pulse was found to be of 0.78+0.05×10-3 mm2/s, 0.74+0.04×10-3 mm2/s, 0.77+0.05×10-3 mm2/s, from the frontal lobes, basal ganglia and occipital lobes, respectively. ADC values after adding the MT pre-pulse from the same location in the frontal lobes, basal ganglia and occipital lobes were found to be significantly higher (p<0.05) when compared with ADC values without MT pre-pulse.

Thus, there is a significant increase in diffusivity of water after the contribution of the macromolecules to the free water is suppressed.

EXAMPLE 2

Preliminary results on in vivo MR experiments and further physical measurements on excised cystic tumors and aspirated abscesses on patients further supported and validated the postulates using the longer, sharper excitation profile off-resonance MT pre-pulse. The abscesses have large cellular component and are highly viscous, whereas fluid from the cystic tumors is less viscous (observed from physical measurements in Table 2).

TABLE 2

Summary of biological parameters and computed ADC with and without MT pre-pulse for abscess and tumors

| Param- | Abscess cavity (n = 12) | | Tumor cavity (n = 6) | | |
|---|---|---|---|---|---|
| eters | Median | Range | Median | Range | *p-value |
| ADC | 0.70 | 0.52-1.79 | 2.99 | 1.99-3.18 | 0.000* |
| ADC_MT | 0.76 | 0.54-1.96 | 3.09 | 2.09-3.38 | 0.000* |
| Protein molecular weight (kD) | 40.31 | 13-134 | 38.00 | 27-114 | 0.892 |
| Cell density | 32000 | 45-280000 | 0 | 0-25 | 0.000* |
| Viscosity | 16.06 | 2.60-1019 | 1.25 | 1-4 | 0.001* |

*using Mann-Whitney U Test

Fluid from cystic lesions was collected at the time of surgery and various biological parameters that are supposed to influence the ADC and MT values namely cell count, concentration of proteins and viscosity were measured. Cell counts were performed using Hemocytometer (Burker-Turk, Japan) and expressed as cells/mm3. Concentration of proteins in the aspirated fluid was measured by Lowry method. Proteins in the fluid were analyzed according to their molecular weight on poly acrylamide gel electrophoresis (PAGE) along with molecular weight marker. Viscosity measurement was carried out using Oswald's viscometer. Bench-top viscometer was used for thick pus from abscesses.

Preliminary results on in vivo MR experiments and further physical measurements on excised cystic tumors and aspirated abscesses on patients further supported and validated the postulates using the longer, sharper excitation profile off-resonance MT pre-pulse. A significantly higher increase in ADC was observed in abscess cavity and its wall than in cystic tumor cavity and its wall as shown in Table 3.

TABLE 3

Summary of ADC values of abscesses and tumors

| Pathology | ADC without MT pulse (Mean +/− SD) $\times 10^{-3}$ mm$^2$/sec | ADC with MT pulse (Mean +/− SD) $\times 10^{-3}$ mm$^2$/sec | p-value |
|---|---|---|---|
| Abscess wall | 0.93 +/− 0.14 | 1.07 +/− 0.17 | <0.0001 |
| Tumor wall | 1.55 +/− 0.39 | 1.68 +/− 0.38 | <0.0001 |
| Abscess cavity | 0.88 +/− 0.40 | 0.99 +/− 0.47 | 0.004 |
| Tumor cavity | 2.84 +/− 0.43 | 2.98 +/− 0.47 | 0.053 |

Yet another unique and important observation is that cell density and viscosity also have a strong influence on the observed increase in ADC in normal brain parenchyma and pathological tissues with very similar range of molecular weights in their macromolecular content.

Thus this invention proposes a tissue differentiation method wherein macromolecular content-dependent, cell density and tissue viscosity dependent increase in ADC values is observed.

The method of tissue differentiation according to the present invention opens up a new way of approaching the histology of the underlying tissue (from a macromolecular content, viscosity and cellular density perspective) that is currently unavailable to determine in an in vivo scenario, even with other existing MRI techniques.

Thus, a method of tissue differentiation according to the present invention improves the tissue specificity in pathologies associated with variable macromolecular size.

Furthermore, a large number of psychiatric patients may benefit from a tracer-free imaging method that could be repeated several times to also study the efficacy of drugs used to cure these diseases.

While the invention has been described in terms of various specific embodiments, those skilled in the art will recognize that the invention can be practiced with various modifications. However all such modifications are deemed to have been covered within the spirit and scope of the claims.

What is claimed is:

1. A method comprising:
applying a magnetization transfer pre-pulse in combination with a diffusion weighted imaging pulse sequence that is a diffusion tensor imaging sequence to produce an image of a tissue under evaluation, the applying further comprising applying diffusion gradient along a plurality of orthogonal directions selected from a group consisting of two orthogonal directions and three orthogonal directions;
generating analysis maps, being apparent diffusion coefficient maps representative of cell density and viscosity of tissue, and measurements from the produced image; and
computing values representative of the macromolecular content of the tissue from the map and measurements, wherein the magnetization transfer pre-pulse suppresses signals from water that is bound to macromolecules.

2. The method according to claim 1 wherein the magnetization transfer pre-pulse comprises an off-resonance Fermi pulse.

3. The method according to claim 1 wherein the magnetization transfer pre-pulse comprises an off-resonance sinc pulse.

4. The method according to claim 1 wherein the magnetization transfer pre-pulse is a binomial pulse.

5. The method according to claim 2 wherein the duration of the magnetization transfer pre-pulse is about 2 to 32 ms.

6. The method according to claim 5 wherein the duration of the magnetization transfer pre-pulse is about 16 ms.

7. The method according to claim 5 wherein the duration of the magnetization transfer pre-pulse is about 8 ms.

8. The method according to claim 2 wherein the flip angle of the magnetization transfer pre-pulse is about 600 to 1100 deg.

9. The method according to claim 8 wherein the flip angle of the magnetization transfer pre-pulse is about 670 deg.

10. The method according to claim 2 wherein the resonance offset of the magnetization transfer pre-pulse is about 400 to 1600 Hz.

11. The method according to claim 10 wherein the resonance offset of the magnetization transfer pre-pulse is about 1200 Hz.

12. The method according to claim 1 wherein the diffusion weighted imaging pulse sequence is a diffusion-weighted echo planar imaging pulse sequence.

13. The method according to claim 1 wherein the diffusion weighted imaging pulse sequence is a single shot diffusion-weighted fast spin echo pulse sequence.

14. The method according to claim 1 wherein the diffusion weighted imaging pulse sequence is a diffusion weighted propeller imaging sequence.

15. The method according to claim 1 wherein the diffusion weighted imaging pulse sequence is a fluid attenuated inversion recovery pulse sequence.

16. The method according to claim 1 wherein the applied magnetization transfer pre-pulse is shaped to have a Fermi envelope.

17. The method according to claim 1 further comprising applying diffusion gradients along three orthogonal directions.

18. The method according to claim 1 wherein the tissue has a substantially high concentration of neurotransmitters.

19. The method according to claim 1 wherein the tissue is afflicted with tumors.

20. The method according to claim 1 wherein the tissue is afflicted with abscesses.

21. The method according to claim 1 wherein the tissue is afflicted with cysts.

22. The method according to claim 1 wherein the tissue is associated with psychiatric disorders.

23. The method according to claim 1 wherein the tissue is associated with normal brain parenchyma.

24. The method according to claim 22 wherein the disorders include one or more from the group consisting of schizophrenia, unipolar depression, bipolar depression, conversion disorders and dissociative convulsions.

25. The method according to claim 1 wherein the image is produced using a tracer-free tissue differentiation in vivo.

26. The method according to claim 22 wherein the image of the tissue is produced for at least one of diagnosis, treatment, evaluation of drug efficacy and follow-up.

27. A method comprising:
applying a magnetization transfer pre-pulse in combination with a diffusion weighted imaging pulse sequence that is a diffusion tensor imaging sequence to produce an image of a tissue under evaluation, the applying further comprising applying diffusion gradients along a plurality of orthogonal directions selected from a group consisting of two orthogonal directions and three orthogonal directions;
generating analysis maps, being apparent diffusion coefficient maps, and measurements from the produced image wherein the obtained analysis maps and measurements are used for fiber tractography and elucidation of white matter tracts; and
computing values representative of the macromolecular content of the tissue from the map and measurements, wherein the magnetization transfer pre-pulse suppresses signals from water that is bound to macromolecules.

* * * * *

UNITED STATES PATENT AND TRADEMARK OFFICE
CERTIFICATE OF CORRECTION

PATENT NO. : 7,634,302 B2  Page 1 of 1
APPLICATION NO. : 10/888600
DATED : December 15, 2009
INVENTOR(S) : Gupta et al.

It is certified that error appears in the above-identified patent and that said Letters Patent is hereby corrected as shown below:

Col. 6,
In claim 1, line 30 "content of the tissue from the map and measurements" should be corrected to "content of the tissues from the map and measurements"

Signed and Sealed this

Twenty-third Day of March, 2010

David J. Kappos
*Director of the United States Patent and Trademark Office*